United States Patent
Cui et al.

(10) Patent No.: US 6,878,644 B2
(45) Date of Patent: Apr. 12, 2005

(54) MULTISTEP CURE TECHNIQUE FOR SPIN-ON-GLASS FILMS

(75) Inventors: Zhenjiang Cui, San Jose, CA (US); Rick J. Roberts, Sunnyvale, CA (US); Michael S. Cox, Davenport, CA (US); Jun Zhao, Cupertino, CA (US); Khaled Elsheref, San Jose, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 7 days.

(21) Appl. No.: 10/430,942

(22) Filed: May 6, 2003

(65) Prior Publication Data

US 2004/0224479 A1 Nov. 11, 2004

(51) Int. Cl.$^7$ .............. H01L 21/31; H01L 21/461; H01L 21/76
(52) U.S. Cl. .............. 438/782; 438/221; 438/424; 438/435; 438/427; 438/787; 438/788
(58) Field of Search .............. 438/221, 359, 438/424, 427, 435, 443, 782, 787, 788, 783

(56) References Cited

U.S. PATENT DOCUMENTS

| | | |
|---|---|---|
| 5,003,178 A | 3/1991 | Livesay |
| 5,312,512 A | 5/1994 | Allman et al. |
| 5,518,950 A | 5/1996 | Ibok et al. |
| 5,728,621 A | 3/1998 | Zheng et al. |
| 5,801,082 A | 9/1998 | Tseng |
| 5,872,043 A | 2/1999 | Chen |
| 5,994,756 A | 11/1999 | Umezawa et al. |
| 6,124,216 A | 9/2000 | Ko et al. |
| 6,132,814 A | 10/2000 | Livesay et al. |
| 6,171,928 B1 | 1/2001 | Lou |
| 6,391,781 B1 | 5/2002 | Ozawa et al. |
| 6,399,461 B1 | 6/2002 | Liu et al. |
| 6,417,073 B2 * | 7/2002 | Watanabe .............. 438/424 |
| 6,448,150 B1 * | 9/2002 | Tsai et al. .............. 438/427 |
| 6,479,369 B1 | 11/2002 | Miyoshi |
| 6,566,229 B2 * | 5/2003 | Hong et al. .............. 438/435 |
| 6,596,607 B2 * | 7/2003 | Ahn .............. 438/424 |
| 6,607,991 B1 * | 8/2003 | Livesay et al. .............. 438/787 |
| 2002/0132486 A1 | 9/2002 | Williams et al. |
| 2002/0175146 A1 | 11/2002 | Dokumaci et al. |

* cited by examiner

Primary Examiner—John F. Niebling
Assistant Examiner—Stanetta Isaac
(74) Attorney, Agent, or Firm—Townsend & Townsend & Crew

(57) ABSTRACT

A method of filling a plurality of trenches etched in a substrate. In one embodiment the method includes depositing a layer of spin-on glass material over the substrate and into the plurality of trenches; curing the layer of spin-on glass material by exposing the spin-on glass material to electron beam radiation at a first temperature for a first period and subsequently exposing the spin-on glass material to an electron beam at a second temperature for a second period, where the second temperature is greater than the first temperature. The method concludes by depositing a layer of silica glass over the cured spin-on glass layer using a chemical vapor deposition technique.

16 Claims, 5 Drawing Sheets

MULTISTEP CURE TECHNIQUE FOR SPIN-ON-GLASS FILMS

CROSS-REFERENCES TO RELATED APPLICATIONS

This is related to concurrently filed and commonly assigned patent application Ser. No. 10/431,031; filed May 6, 2003, entitled "GAPFILL PROCESS USING A COMBINATION OF SPIN-ON-GLASS DEPOSITION AND CHEMICAL VAPOR DEPOSITION TECHNIQUES," having Zhenjiang Cui, Rick J. Roberts, Michael S. Cox, Jun Zhao, Khaled Elsheref and Alex Demos listed as co inventors. The application Ser. No. 10/431,031 is assigned to Applied Materials Inc., the assignee of the present invention, and is hereby incorporated by reference.

BACKGROUND OF THE INVENTION

One of the most popular techniques of isolating adjacent active devices in modern integrated circuits is referred to as shallow trench isolation (STI). Such isolation techniques generally etch shallow trenches in the silicon substrate, fill the etched trenches with a dielectric material and then planarize the structure back to the silicon surface in the areas outside the trench. Active devices can then be built in the spaces or islands between the isolation regions.

FIGS. 1A–1D are simplified cross-sectional views of a partially completed integrated circuit illustrating a common STI formation process formed on a silicon substrate 10. Referring to FIG. 1A, a typical shallow trench isolation structure is created by first forming a thin pad oxide layer 12 over the surface of substrate 10 and then forming a silicon nitride layer 14 over pad oxide layer 12. The nitride layer acts as a hard mask during subsequent photolithography processes and the pad oxide layer provides adhesion of the nitride to the silicon substrate and protects the substrate when the nitride layer is removed near the end of the STI formation process.

Next, as shown in FIG. 1B, a series of etch steps are performed using standard photolithography techniques to pattern the nitride and oxide layers and form trenches 20 in silicon substrate 10. The photoresist (not shown) is then removed and a trench lining layer 16, such as an in situ steam generation (ISSG) oxide or other thermal oxide layer or a silicon nitride layer, is usually formed.

Referring to FIG. 1C, trenches 20 are then filled with an insulating material, such as gapfill silicon oxide layer 22, using a deposition process that has good gapfill properties. One or more additional steps including chemical mechanical polishing (CMP) are then used to remove nitride layer 14 and pad oxide layer 12 and level the gapfill oxide 22 to the top of the trench (surface 24) as shown in FIG. 1D. The remaining insulating oxide in the trenches provides electrical isolation between active devices formed on neighboring islands of silicon.

Most integrated circuits include some regions that are isolated by relatively narrow trenches, e.g., in the active areas 26 shown in FIGS. 1B–1D, along with some regions that are isolated by much wider trenches, e.g., in open areas 28, that may be an order of magnitude or more wider than trenches in the active areas. Additionally, the narrow-width trenches used in many integrated circuits have very high aspect ratios making the filling of trenches 20 one of the most challenging gapfill applications in the formation of the integrated circuit. The presence of both high-aspect-ratio, narrow-width trenches and relatively wide trenches in different parts of the silicon substrate make the filling of the trenches even more challenging.

A variety of different gapfill techniques have been developed to address such situations. Despite the many successes achieved in this area, semiconductor manufacturers are continuously researching alternative techniques to fill such gaps as well as improved techniques to fill the even more aggressive aspect ratio gaps that will likely be required in future processes.

BRIEF SUMMARY OF THE INVENTION

Embodiments of the present invention deposit an insulating material that can be used to fill trenches or gaps between adjacent raised features. The techniques of the invention are particularly useful for filling trenches associated with shallow trench isolation structures in integrated circuits but can be used in a variety of other applications including, but not limited to, the formation of premetal and intermetal dielectric layers in integrated circuits.

In one embodiment a method of filling a plurality of trenches etched in a substrate is disclosed. The method includes depositing a layer of spin-on glass (SOG) material over the substrate and into the plurality of trenches; exposing the layer of spin-on glass material to a solvent; curing the layer of spin-on glass material; and depositing a layer of silica glass over the cured spin-on glass layer using a chemical vapor deposition technique.

In another embodiment the method includes depositing a layer of spin-on glass material over the substrate and into the plurality of trenches; curing the layer of spin-on glass material by exposing the spin-on glass material to electron beam radiation at a first temperature for a first period and subsequently exposing the spin-on glass material to an electron beam at a second temperature for a second period, where the second temperature is greater than the first temperature. The method concludes by depositing a layer of silica glass over the cured spin-on glass layer using a chemical vapor deposition technique.

These and other embodiments of the invention along with many of its advantages and features are described in more detail in conjunction with the text below and attached figures.

DETAILED DESCRIPTION OF THE INVENTION

Embodiments of the invention employ a combination of spin-on glass (SOG) and chemical vapor deposition techniques to deposit insulating material, such as silicon oxide material, in trenches and gaps between adjacent raised features. The inventors have developed methods of combining such SOG and CVD deposition processes to complete STI structures in a manner that is superior to using either of SOG deposition or CVD techniques alone.

Figure 2:
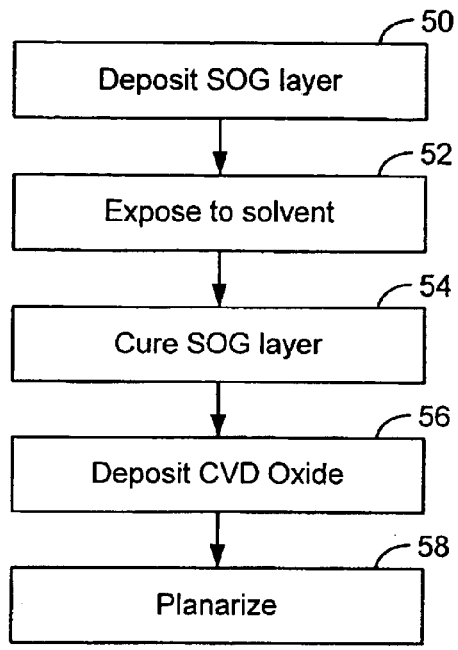
FIG. 2 is a flowchart depicting steps associated with one embodiment of the invention.

In order to better appreciate and understand the present invention, reference is first made to FIGS. 2 and 3A–D. FIG. 2 is a flowchart depicting steps associated with one embodiment of the invention as used in a shallow trench isolation (STI) application while FIGS. 3A–D are simplified cross-sectional views of a substrate processed according to the sequence set forth in FIG. 2.

Figure 1A:
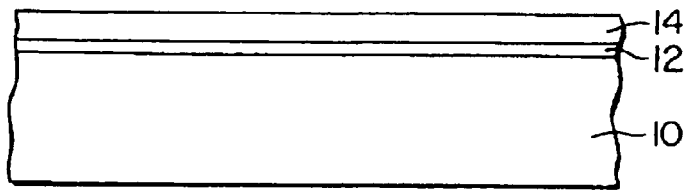
FIGS. 1A–1D are simplified cross-sectional views of a substrate illustrating a previously known shallow trench isolation formation process.
Figure 1B:
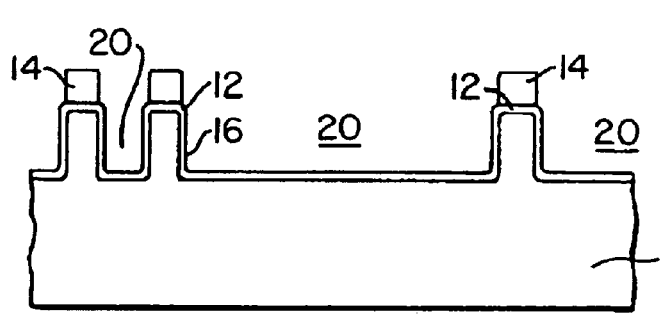
Figure 1C:
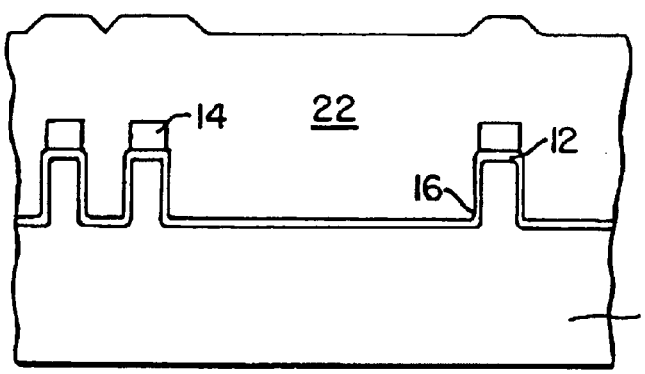
Figure 1D:
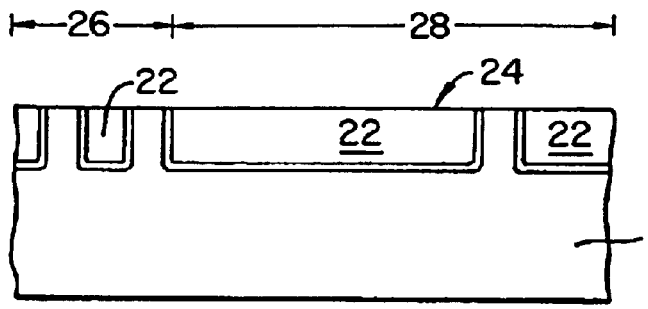
Figure 3A:
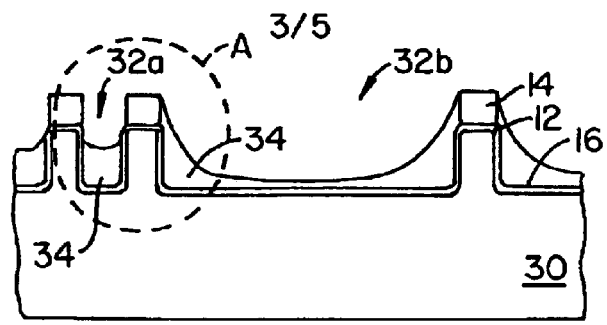
FIGS. 3A–D are simplified cross-sectional views of a substrate processed according to the sequence set forth in FIG. 2.

The process starts by depositing a spin-on glass (SOG) layer over a silicon substrate 30 (FIG. 2, step 50 and FIG. 3A). Referring to FIG. 3A, prior to depositing the SOG layer, substrate 30 includes a plurality of trenches suitable for forming a shallow trench isolation structure, such as trenches etched through a silicon/silicon oxide/silicon nitride stack as discussed above with respect to FIG. 1B. For convenience, the same reference numbers are used in both FIG. 1B and FIGS. 3A–3C to represent similar elements. Thus, the substrate shown in FIG. 3A includes a nitride layer 14 deposited over an oxide layer 12 which is in turn formed over the silicon substrate in areas outside the trenches. Also shown in FIG. 3A is a liner layer 16 formed within the trenches. It is to be understood that embodiments of the invention are useful in any shallow trench isolation technique regardless of the composition of materials in the raised material stacks separated by the trenches and that the invention is useful for spin-on dielectric materials other than SOG.

The SOG material can be deposited using standard SOG deposition techniques as is known to those of skill in the art. A number of different SOG precursors can be used in step 50 including precursors available from Dow Corning, Honeywell and Air Products. The precursor should be chosen to have, among other properties, gapfill characteristics and a dielectric constant suitable for STI applications. In one embodiment, FOx™, a flowable, inorganic polymer available from Dow Corning is used. FOx™ is a liquid solution of hydrogen silsesquioxane in a solvent that has a dielectric constant less than 2.9, good gapfill properties and a low defect density.

As shown in FIG. 3A, deposition of the SOG material results in a partial filling of the trenches including narrow-width, high-aspect-ratio trenches 32a and wide-width trenches 32b with SOG 34. The SOG material is effective at filling much of the narrow-width, high-aspect-ratio trenches 32a. It is generally not as effective at filling the wide-width trenches 32b unless several or more applications, i.e., layers, of the SOG material are applied sequentially. Also, even after being cured, the SOG material has a higher number of undesirable Si—Si bonds than some CVD oxide films such as HDP-CVD oxide layers. Such Si—Si bonds are easy to oxidize into Si—O bonds and may result in uncontrolled changes to film properties after the SOG film is deposited. Accordingly, embodiments of the invention address these issues by depositing an oxide layer over the SOG material using chemical vapor deposition techniques as described in detail below.

Figure 3B:
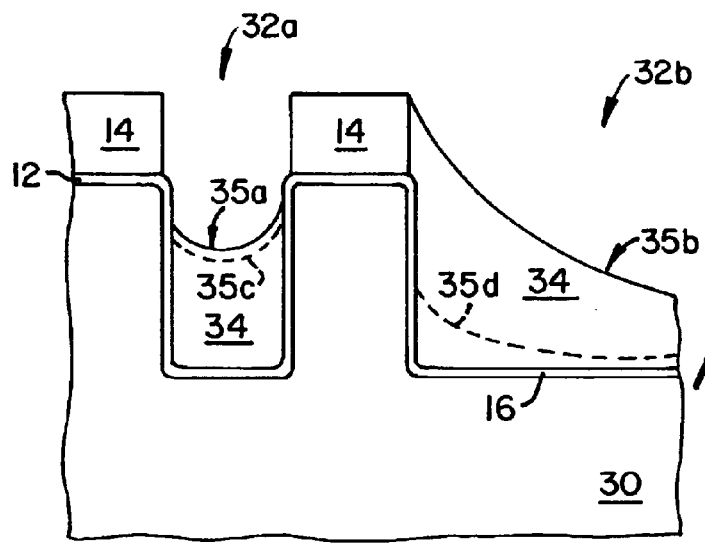

Prior to depositing the CVD oxide layer, embodiments of the invention expose the substrate and SOG material to a solvent (FIG. 2, step 52) in order to dissolve some of the SOG material in the wide-width trenches. Referring to FIG. 3B, which is an enlarged view of area A shown in FIG. 3A, the SOG material deposited in step 50 adheres to the sidewalls of the trenches creating a meniscus 35a and 35b in the narrow-width and wide-width trenches, respectively. The top of meniscus 35a in the narrow-width trenches 32a is generally below the bottom of nitride layer 14. The top of meniscus 35b in the wide-width trench, however, contacts the sidewall of the trench at a point at or near the top of nitride layer 14.

The inventors have determined that it is desirable to remove the SOG material 34 from all areas above the bottom of pad oxide layer 12 prior to deposition of the CVD oxide layer. The SOG material and subsequently deposited CVD oxide film have different physical properties and thus different wet etch rates and/or different planarization rates when exposed to a CMP process. During subsequent planarization (FIG. 2, step 58) of the substrate, the nitride and oxide layers 14 and 12 are removed. The nitride and pad oxide layers have physical properties that are similar to the CVD oxide layer and thus can be removed at approximately the same rate allowing for a highly planarized surface to be formed in step 58. If, however, the material removed during the planarazation step included SOG material 34 in some areas of the trenches and CVD oxide in other areas of the trenches, the different removal rates of these materials may result in an uneven surface.

Figure 4A:
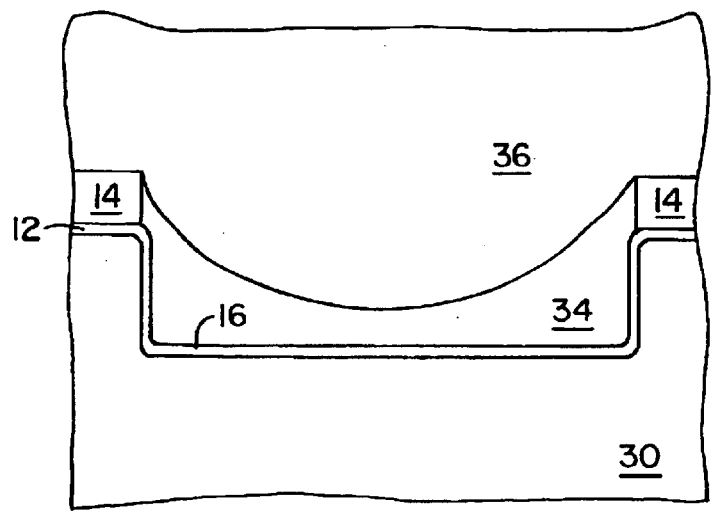
FIGS. 4A and 4B are simplified cross-sectional views of a substrate that illustrate a potential problem associated with planarizing a substrate having both SOG and CVD layers deposited within wide-width trenches when solvent treatment step 54 of FIG. 2 is not employed.
Figure 4B:
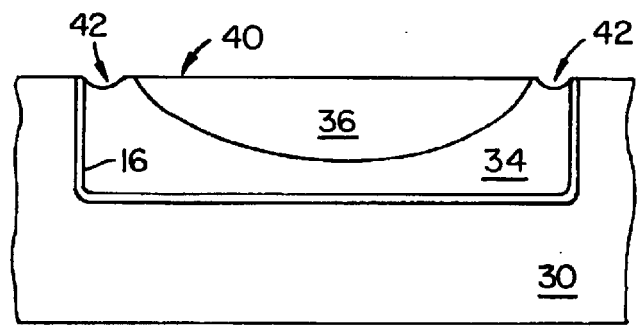

This phenomenon is depicted in FIGS. 4A and 4B. In FIG. 4A, an individual trench is filled above the bottom of pad oxide layer 12 with both SOG material 34 and CVD oxide material 36. During a subsequent planarization step, the SOG material has a higher WER than the nitride layer 14, pad oxide layer 12 and oxide layer 36 which in turn results in an uneven surface 40 after the planarization step having concaved areas 42 as shown in FIG. 4B.

Embodiments of the invention remove the meniscus portion of the SOG material in the wide-width trenches by exposing the material to a solvent prior to curing the SOG material. The solvent dissolves some of the uncured SOG material including all or at least most of the material that is attached to the trench sidewalls above the bottom surface of the pad oxide layer as shown in FIG. 3B by dotted lines 35c and 35d. In one embodiment the solvent is isopropyl alcohol (IPA) but it a variety of other solvents may be used as can be determined by a person of skill in the art. In some embodiments, the solvent is a hydrophobic solution because the SOG solution is also hydrophobic.

The solvent can be applied using spray and/or spin techniques as is known in the art and is generally allowed to dry prior to curing the SOG film. The inventors have found that such a solvent treatment is effective at removing the SOG material from the trench sidewalls above the pad oxide level while beneficially not removing much SOG material from within the narrow-width trenches. Thus the solvent treatment does not adversely effect the gapfill capabilities of the SOG material in a significant manner.

In one embodiment the solvent is applied sprayed on the substrate while the substrate is spun as is done in a traditional SOD deposition system. Spinning the substrate during and after application of the solvent helps the solvent dry faster. In one particular embodiment the substrate is not heated during the solvent treatment step and it is spun at a rate less than 1000 rpm for one minute or less.

Figure 3C:
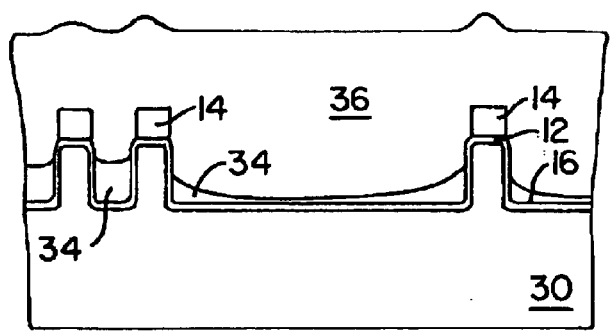

Referring to FIG. 3C, after solvent treatment step 52, the SOG material is cured to remove hydrogen from the material (FIG. 2, step 54) and a CVD oxide layer 36 is deposited over the substrate (FIG. 2, step 56). The cure step generally causes dehydrogenation (Si—H+Si—H→Si—Si) and rearrangement/dehydration (—Si—H+—Si—O →—Si—O—H+—Si—; —Si—O—H+—Si—O—H→—Si—O—Si—+H$_2$O) of the SOG material resulting in Si—Si and Si—O—Si dominated bonding. The SOG material can be cured using a standard thermal cure step or by exposing the material to suitable radiation such as radiation from an electron beam. In other embodiments, however, the SOG material is cured in a multistep process as described below with respect to FIG. 5.

Figure 3D:
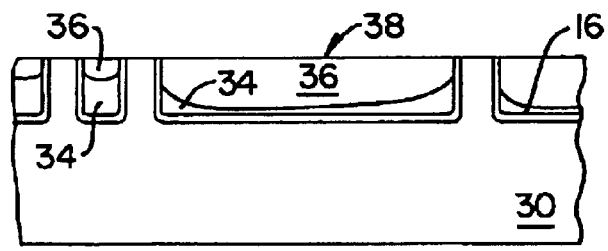

CVD oxide layer 36 can be deposited using any appropriate CVD technique as is known to those of skill in the art. In some embodiments, however, CVD oxide layer 36 is deposited using high density plasma (HDP-CVD) techniques from a process gas of silane (SiH$_4$) and molecular oxygen (O$_2$). After deposition of CVD oxide layer 36, the substrate is planarized (FIG. 2, step 58) to a planar surface 38 to remove the nitride and pad oxide layers and create the final STI structure as shown in FIG. 3D.

In another embodiment of the invention, the inventors developed a multistep cure technique that exposes the SOG film to radiation from an electron beam. This embodiment is discussed in more detail in conjunction with FIG. 5, which is a flowchart depicting the steps associated with this electron beam cure technique and FIG. 6, which is a simplified cross-sectional view of a substrate having several narrow-width gaps filled in accordance with the process of FIG. 5. The process shown in FIG. 5 starts with deposition of SOG material 72 over substrate 70 (step 60) and into trenched 74 as shown in FIG. 6, substrate 70 also includes a patterned nitride/oxide stack 14, 12 as was shown in FIG. 1B.

Figure 7:
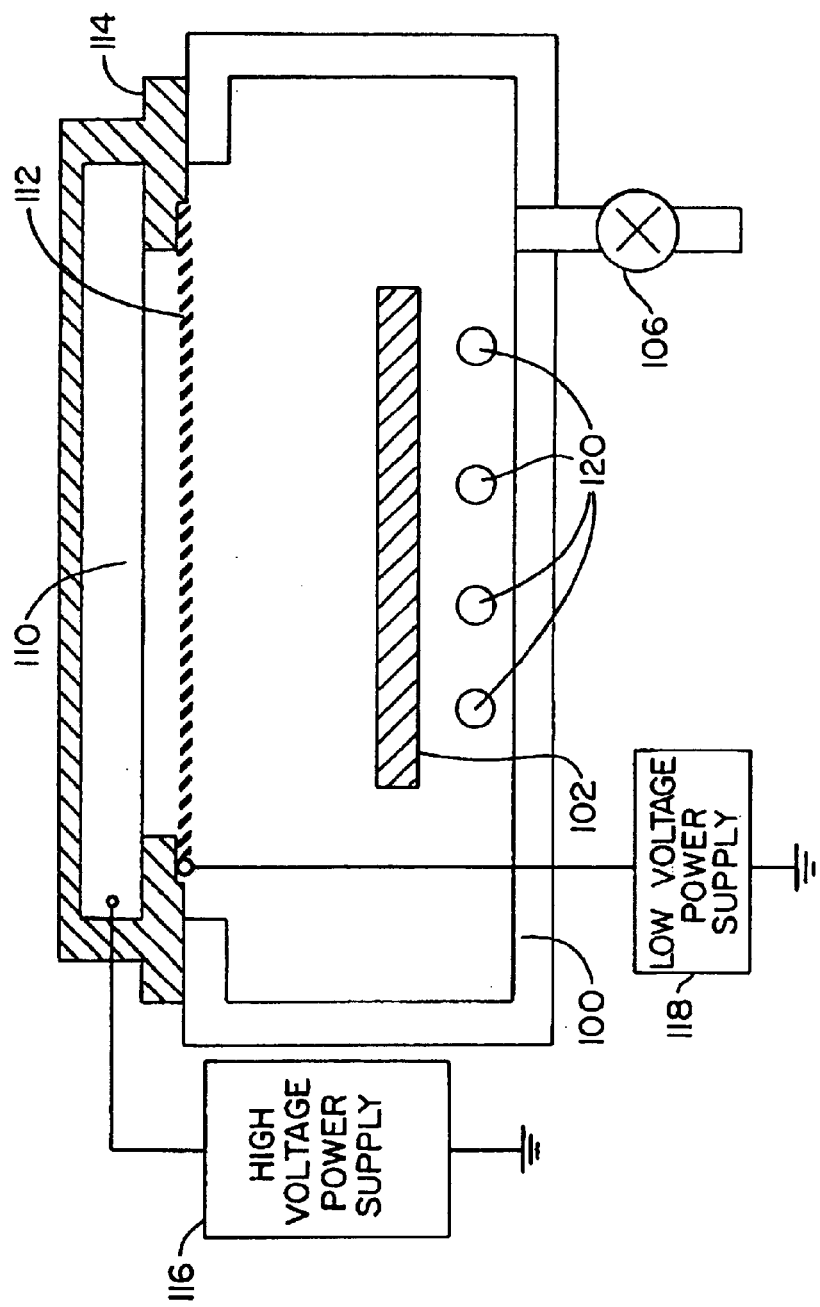
FIG. 7 is a simplified, cross-sectional view of an exemplary chamber that can be used to perform electron beam radiation curing steps discussed with respect to FIG. 5 in accordance with some embodiments of the present invention.

Next, SOG material 72 is cured using a multistep electron beam radiation curing process. A variety of different tools can be used to perform the electron beam cure process. In one embodiment the ebeam cure is carried out using a ebeam cure vacuum chamber similar to that described in U.S. Pat. No. 6,132,814, which is hereby incorporated by reference. A simplified, cross-sectional view of such an ebeam cure chamber is shown in FIG. 7. As shown in FIG. 7, a substrate 102 can be placed in chamber 100 and positioned underneath an electron source 104. The chamber can be evacuated to a pressure between, for example, 15–40 millitorr with a vacuum pump 106. The electron source can be any source that works in such a vacuum environment. One example of a suitable electron source which generates a large uniform and stable source of electrons is described in more detail in U.S. Pat. No. 5,003,178, which is hereby incorporated by reference.

Electron source 104 includes a cathode 110 and an anode 112 separated by an insulating member 114. The potential between these two electrodes is generated by a high voltage supply 116 applied to the cathode and a bias voltage supply 118 applied to the anode. The temperature of substrate 102 can be controlled during the ebeam curing process by quartz lamps 120 that irradiate the bottom side of the substrate to provide heat independent of the electron beam.

The multistep ebeam curing process starts by transferring the substrate to ebeam cure chamber 100 and exposing it to electron beam radiation at a first, relatively low temperature (step 62). In one embodiment cure step 62 exposes the substrate to an electron beam at room temperature for about three minutes by not heating the substrate with the quartz lamps. During this portion of the ebeam cure step the substrate is heated above room temperature by the ebeam (e.g., to a temperature of between 70–200° C.) but little or no additional heating of the substrate occurs.

The amount of energy used during the ebeam radiation step is selected to be sufficient for the electrons to reach the bottom of the trench. The inventors have found that exposure to ebeam radiation at such relatively low temperatures allows the electrons to penetrate further into SOG material 72 than if a relatively high temperature is initially used. The use of too high a curing temperature during step 62 may result in the formation of a crust of cured SOG material on the upper surface of the SOG material in the trenches. The early occurrence of such crusting impairs electron penetration into the trenches thus making it difficult to adequately cure the SOG material all the way down to trench bottoms.

Figure 5:
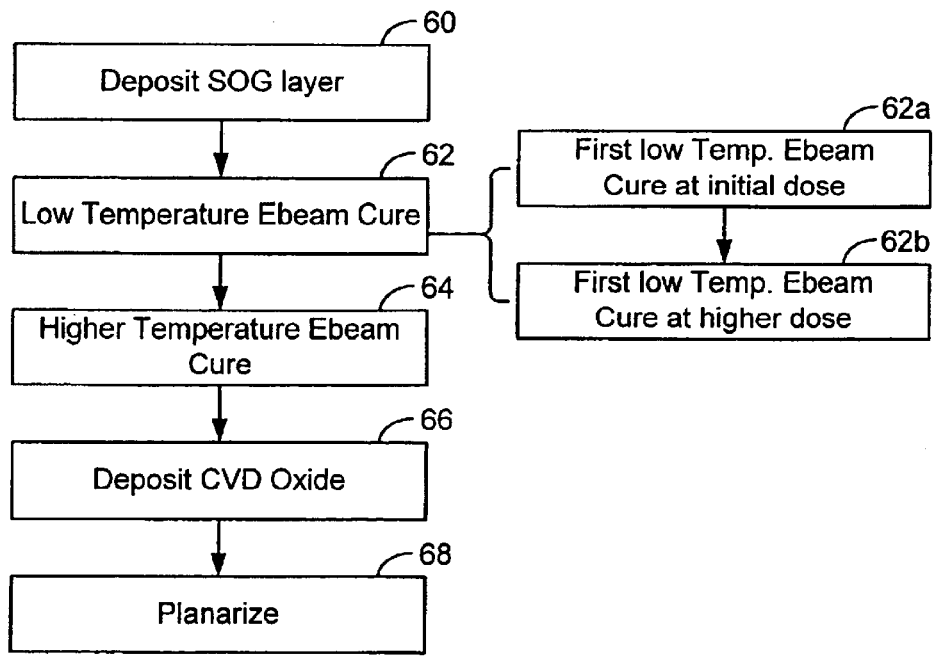
FIG. 5 is a flowchart depicting steps associated with another embodiment of the invention.
Figure 6:
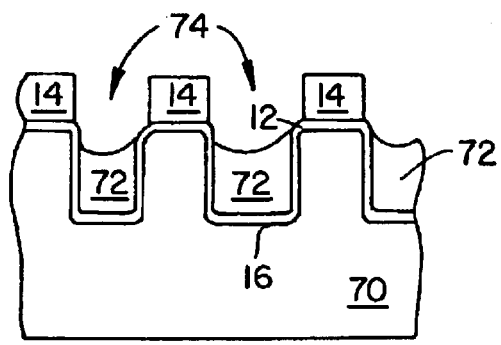
FIG. 6 is a simplified cross-sectional view of a substrate having narrow-width trenches filled with SOG material according to the embodiment set forth in FIG. 5.

Next, the temperature of the substrate is increased with the quartz lamp heater (or by other means) and the substrate is exposed to additional electron beam radiation at the increased temperature (FIG. 5, step 64). In one embodiment, cure step 64 exposes the substrate to an electron beam at a temperature between 350–450° C. for about three minutes during step 64. In some embodiments, there is at least a 50° C. difference in substrate temperature between steps 62 and 64 while in other embodiments there is at least a 150° C. difference in temperature.

In one embodiment both curing step 62 and 64 are performed in an ozone/oxygen environment in order to create more O—Si—O bonds and less Si—Si bonds. In other embodiments, the curing can be performed in a ozone/oxygen/inert gas ambient or in just an inert gas ambient, however. In one particular embodiment cure step 62 exposes the SOG material to an electron dose of 16 keV and 3750 uC/cm$^2$ at 195° C. (the temperature the substrate reaches without additional heating from the quartz lamps) and then exposes the SOG material to the same electron dose at a temperature of 400° C. by switching on the quartz lamp heater during step 64.

Experiments performed by the inventors have determined that such a two-step curing technique is superior to both conventional thermal curing processes and to ebeam curing techniques that use a single step. In other embodiments, more than two discrete ebeam cure steps may be used. For example, in one embodiment step 62 is divided into two steps 62a and 62b where the electron dose is increased from a first level to a second level from step 62a to step 62b. In another embodiment an intermediate step, between steps 62 and steps 64, is performed in which the substrate is heated to a temperature higher than done in step 62 but lower than done in step 64. In other embodiments four or more discrete ebeam cure steps may be employed.

In some embodiments, the multistep cure technique shown in and discussed with respect to FIG. 5 can be used in place of cure step 54 in FIG. 2. In other embodiments, however, the cure technique disclosed in FIG. 5 can be used to form an SOG gapfill film independent of the solvent treatment step and CVD deposition steps shown in FIG. 2. After the SOG layer is cured, a CVD oxide layer is deposited over the substrate (FIG. 5, step 66) and the substrate is planarized (FIG. 5, step 68).

Additional embodiments of the invention add an oxygen plasma treatment step after either SOG cure step 52 or steps 62, 64 and prior to the deposition of a CVD oxide layer. The oxygen plasma treatment step exposes the cured SOG material to an in situ plasma formed from molecular oxygen or another oxygen source in order to further oxidize the SOG material and convert as many remaining Si—Si bonds as possible to Si—O bonds. In one embodiment the oxygen plasma treatment exposes the substrate to an oxygen plasma formed in a Ultima HDP-CVD chamber manufactured by Applied Materials, the assignee of the present invention, for between 0.5–10 minutes.

Still other embodiments of the invention apply and cure multiply layers of SOG material prior to depositing the CVD oxide layer. For example, in one embodiment, a layer of SOG material is deposited over the substrate to partially fill about one quarter of the height of the narrow-width trenches. If appropriate, the SOG material is then exposed to solvent prior to being cured to remove SOG material from the wide-width trenches. Next, a second layer of SOG material is formed to approximately halfway fill the narrow-width trenches. Again the material is exposed to the solvent, if appropriate, and cured. The remainder of the trenches can then be filled with a CVD oxide as disclosed above.

The description above has been given to help illustrate the principles of this invention. It is not intended to limit the scope of this invention in any way. A large variety of variants are apparent, which are encompassed within the scope of this invention. While the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of filling a plurality of trenches etched in a substrate, the method comprising:
   depositing a layer of spin-on glass material over the substrate and into the plurality of trenches;
   curing the layer of spin-on glass material by exposing the spin-on glass material to electron beam radiation during a first period then increasing a temperature of the substrate and exposing the spin-on glass material to an electron beam during a second period; and
   depositing a layer of silica glass over the cured spin-on glass layer using a chemical vapor deposition technique.

2. The method of claim 1 wherein the substrate is heated primarily by the electron beam during the first portion of the curing process.

3. The method of claim 2 wherein the substrate is heated by a combination of the electron beam and a separate heater during the second portion of the curing process.

4. The method of claim 1 wherein the temperature of the substrate is increased by at least 50 degrees Celsius between the first period and the second period.

5. The method of claim 1 wherein the temperature of the substrate is increased by at least 150 degrees Celsius between the first period and the second period.

6. The method of claim 1 further comprising, during the first period of the curing process, increasing a dose of radiation that the substrate is exposed to from a first dose level to a second dose level that is higher than the first dose level.

7. The method of claim 1 wherein the substrate is heated to a temperature above room temperature during the first period.

8. The method of claim 1 wherein the substrate is heated to a temperature between 70–200° C. during the first period.

9. The method of claim 1 wherein the substrate is heated to a temperature between 350–450° C. during the second period.

10. A method of processing a substrate having a plurality of trenches formed thereon, the method comprising:
    depositing a layer of spin-on glass material over the substrate and into the plurality of trenches;
    curing the layer of spin-on glass material by exposing the spin-on glass material to electron beam radiation while increasing a temperature of the substrate by at least 50 degrees Celsius during the exposing process; and
    depositing a layer of silica glass over the cured spin-on glass layer.

11. The method of claim 10 wherein the layer of silica glass is deposited using a chemical vapor deposition technique.

12. The method of claim 10 wherein the exposing process comprises a plurality of discrete steps in which the temperature is increased in each step.

13. The method of claim 10 wherein the temperature of the substrate is increased by at least 150 degrees Celsius during the exposing process.

14. The method of claim 13 wherein the exposing process comprises a plurality of discrete steps in which the temperature is increased in each step.

15. The method of claim 13 wherein the substrate is heated from a temperature between 70–200° C. in an initial stage of the exposing process to a temperature between 350–450° C. during a stage subsequent to the initial stage of the exposing process.

16. The method of claim 13 wherein the substrate is heated primarily by the electron beam during an initial portion of the curing process and heated by a combination of the electron beam and a separate heater during a portion of the curing process subsequent to the initial portion.

* * * * *